June 29, 1965 J. G. HUMPHREY 3,192,316
AUTOMATIC GAIN CONTROL CIRCUIT WITH OPTIMUM DELAYED AND AMPLIFIED A.G.C. FOR R.F. STAGE
Filed Oct. 19, 1960 6 Sheets-Sheet 1

INVENTOR:
JOHN G. HUMPHREY,
BY Joseph Levinson
HIS ATTORNEY.

June 29, 1965 J. G. HUMPHREY 3,192,316

AUTOMATIC GAIN CONTROL CIRCUIT WITH OPTIMUM DELAYED AND AMPLIFIED A.G.C. FOR R.F. STAGE

Filed Oct. 19, 1960 6 Sheets-Sheet 2

INVENTOR:
JOHN G. HUMPHREY,

BY Joseph Levinson

HIS ATTORNEY.

June 29, 1965 J. G. HUMPHREY 3,192,316

AUTOMATIC GAIN CONTROL CIRCUIT WITH OPTIMUM DELAYED AND AMPLIFIED A.G.C. FOR R.F. STAGE

Filed Oct. 19, 1960 6 Sheets-Sheet 3

INVENTOR:
JOHN G. HUMPHREY,

BY Joseph Levinson
HIS ATTORNEY.

INVENTOR:
JOHN G. HUMPHREY,
BY Joseph Levinson
HIS ATTORNEY.

INVENTOR:
JOHN G. HUMPHREY,
BY Joseph Levinson
HIS ATTORNEY.

INVENTOR:
JOHN G. HUMPHREY.
BY Joseph Levinson
HIS ATTORNEY.

United States Patent Office 3,192,316

Patented June 29, 1965

3,192,316

AUTOMATIC GAIN CONTROL CIRCUIT WITH OPTIMUM DELAYED AND AMPLIFIED A.G.C. FOR R.F. STAGE

John G. Humphrey, Mattydale, N.Y., assignor to General Electric Company, a corporation of New York Filed Oct. 19, 1960, Ser. No. 63,648
13 Claims. (Cl. 178—7.3)

This invention relates to an automatic gain control circuit for multi-stage receivers and, more particularly, relates to an automatic gain control circuit employing a transistor amplifier for regulated application of an automatic gain control voltage to the radio frequency stage of a television receiver.

In many applications, automatic gain control of each stage of the receiver circuitry must be provided. A common example of such application is found in television receivers, and this application will be employed for illustration in this specification. In television receivers, automatic gain control of both the intermediate frequency (I.F.) and radio frequency (R.F.) amplifier stages must be provided. To insure that ampulifier gains are not reduced until the output voltage at the second detector has reached the desired operating level, the feedback voltage for A.G.C. purposes is usually derived from the second detector.

Since the D.C. output voltage of the second detector stage varies with the video content, the voltage is not completely satisfactory for use as an A.G.C. control voltage, although such use has been made of it in many receivers. In most receivers, however, a feedback voltage is derived so as to be essentially dependent upon the height of the horizontal sync pulses to eliminate the dependency of the output signal upon picture content. Such means known to the art are the employment of a keyed A.G.C. system or derivation of the feedback voltage from the linear addition of the second detector output voltage and the voltage obtained from the grid of the sync clipper. Since the sync clipper grid voltage varies with picture content in a manner essentially opposite to that of the variation at the second detector stage, the two voltages may be combined to yield a feedback voltage which is substantially independent of picture content for a given sync height.

The feedback voltage so derived is used to directly control the gain of the I.F. stage of the receiver. Control of the gain of the R.F. stage is preferably delayed so that it does not start to reduce the gain of the R.F. stage until the gain of the I.F. stage has been reduced by a substantial amount. Since the converter stage is generally somewhat noisier than a straight amplifier stage, the delay in application of R.F. A.G.C. voltage maintains a good signal-to-noise ratio. However, once R.F. gain control starts, the R.F. A.G.C. voltage must rise rapidly to prevent driving the I.F. stage close to cut off resulting in distortion of the waveform passing through the I.F. stage.

The art is familiar with A.G.C. systems using a diode clamp to control the time of application of the feedback signal to the R.F. stage. However, in order to provide the desired fast rise of the R.F. feedback signal, it is necessary to apply a high voltage which has conventionally been obtained directly from the clipper grid. Thus, in such systems, the R.F. signal is dependent upon the picture content.

It is, therefore, the primary object of this invention to provide an improved automatic gain control circuit for a multi-stage receiver in which the amplifier gain of R.F. and I.F. sections are self-regulating.

In accordance with this object, there is provided, in a preferred embodiment of this invention, means for deriving a feedback signal and applying said signal for control of the receiver I.F. stage gain. A transistor amplifier is provided having a base, collector and emitter electrodes connected in the grounded base configuration. The emitter electrode is coupled to the cathode of an I.F. amplifier tube and the amplified signal is applied to control the gain of the R.F. stage.

The delay of the R.F. A.G.C. voltage is accomplished without using additional diodes and the I.F. A.G.C. bias is automatically regulated to prevent cut-off of the I.F. amplifier stages.

Means are provided to vary the delay of application of the signal to the R.F. stage.

Means are provided for compensation of collector cut off current for high temperature operations.

This invention will be more clearly understood by reference to the following description taken in combination with the accompanying drawing, of which:

Figure 1:
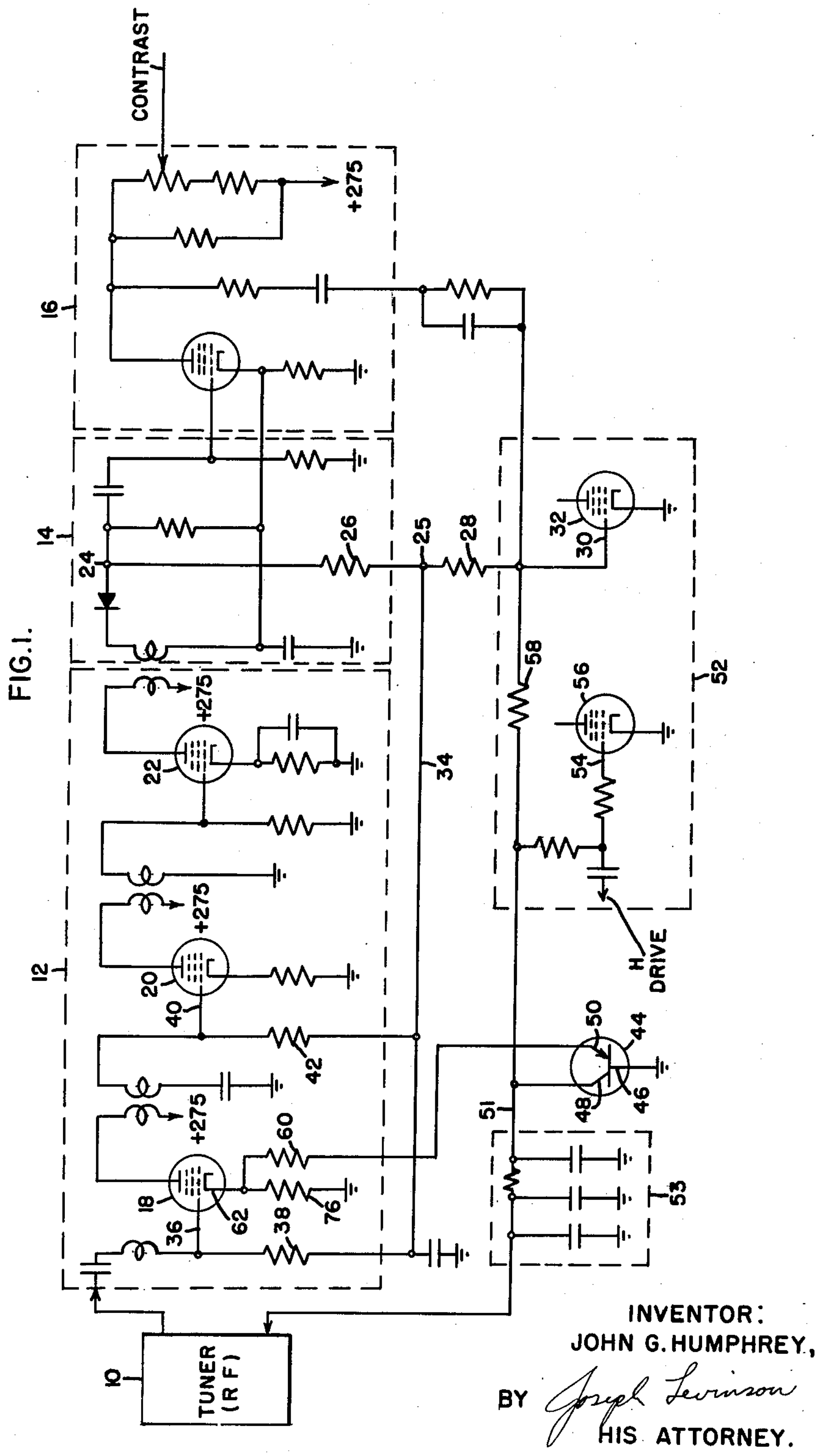
FIGURE 1 is a schematic diagram of a multi-stage receiver in accordance with the present invention.
Figure 3:
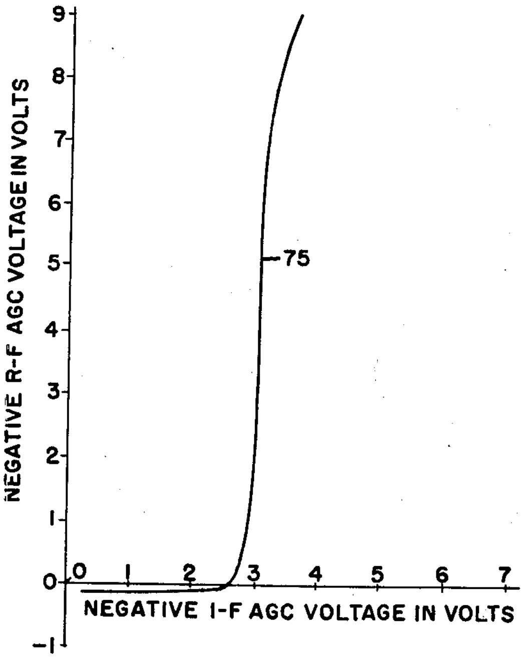
Figure 4:
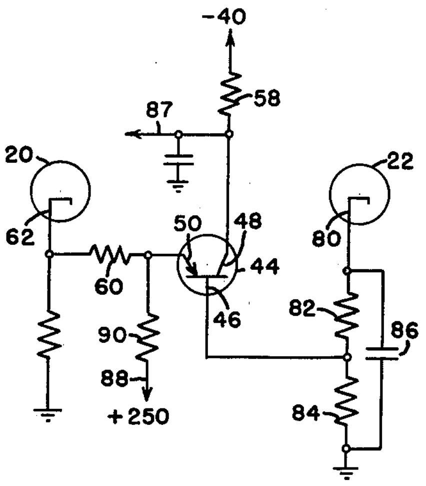
Figure 5:
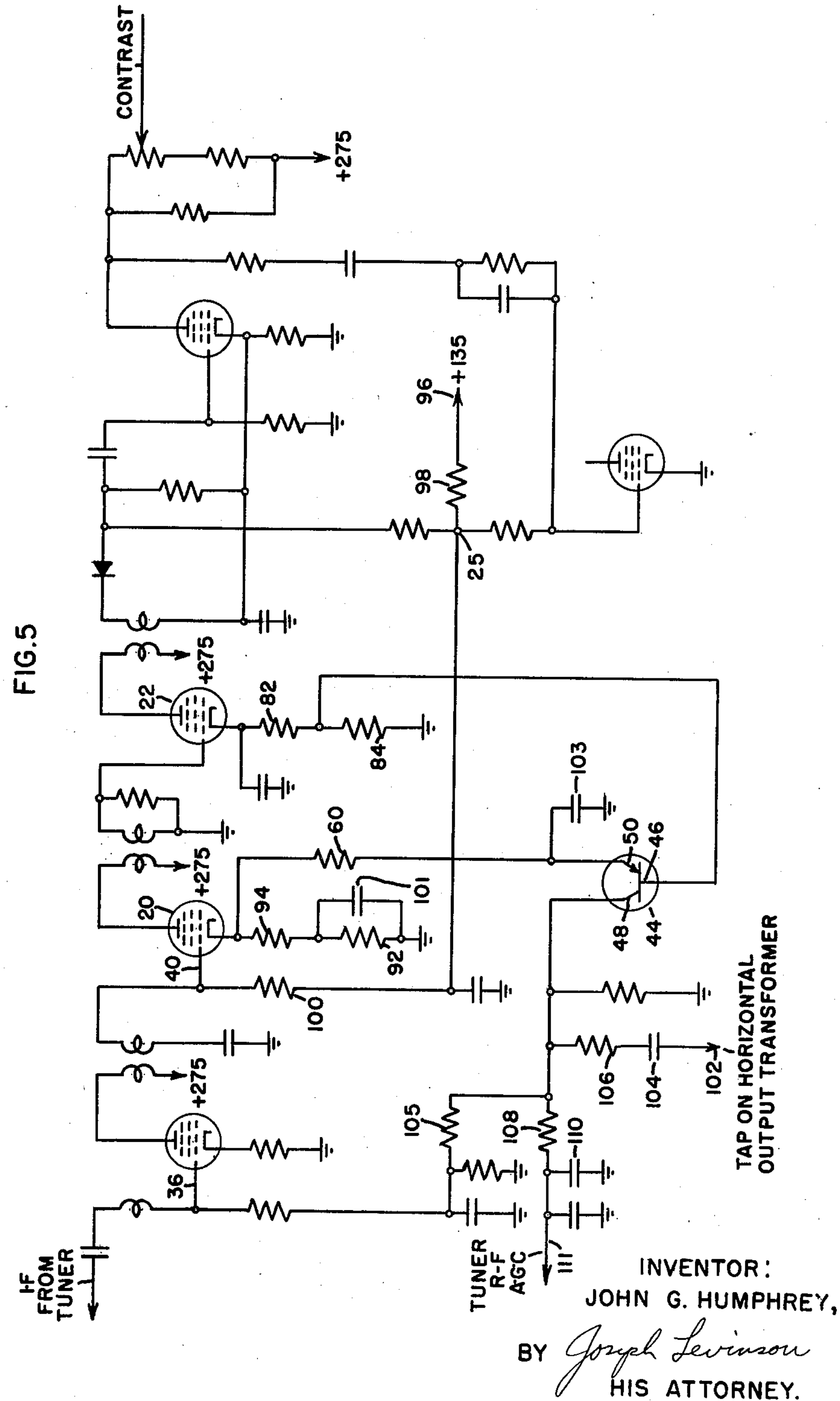
Figure 6:
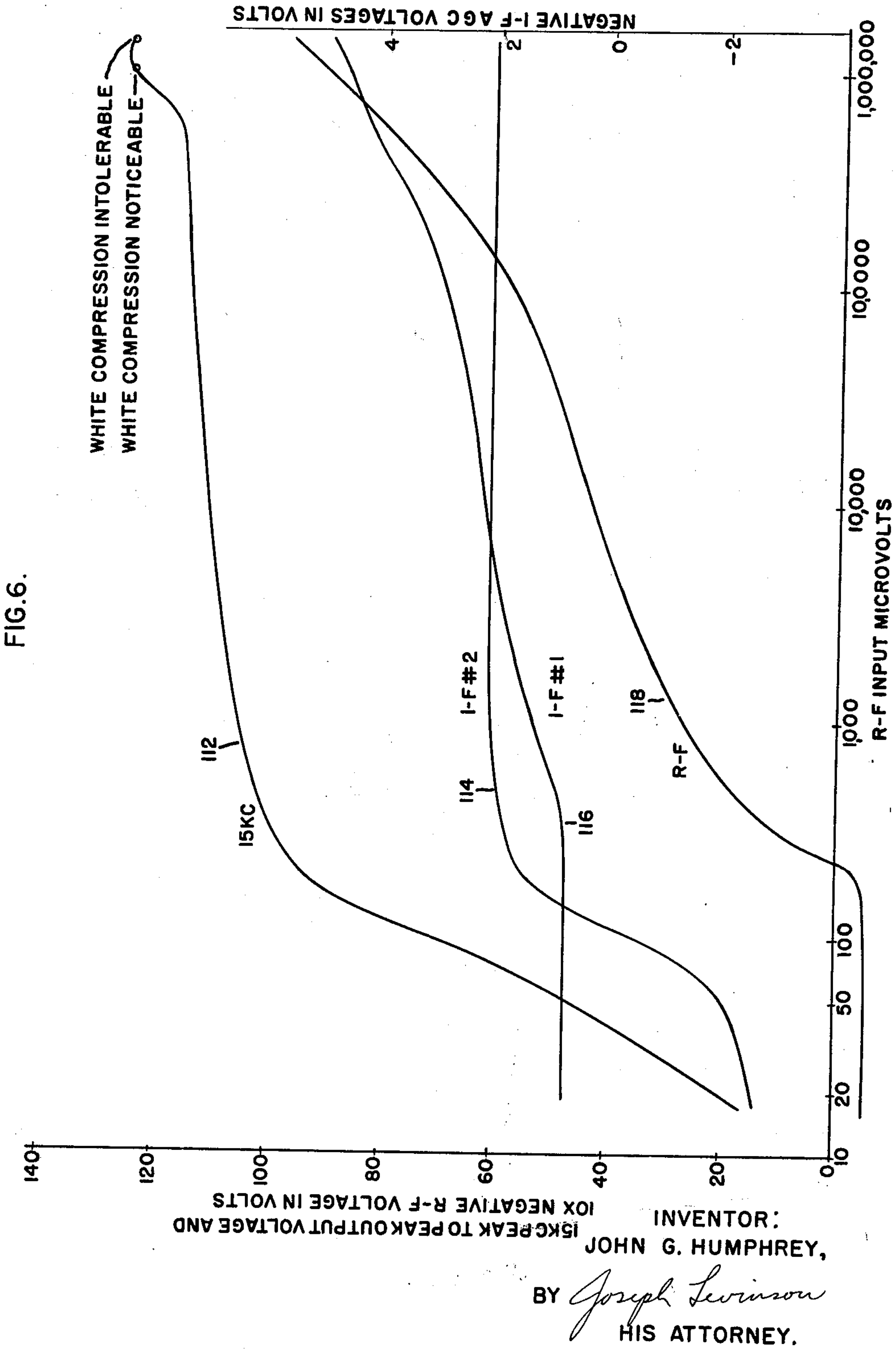
Figure 7:
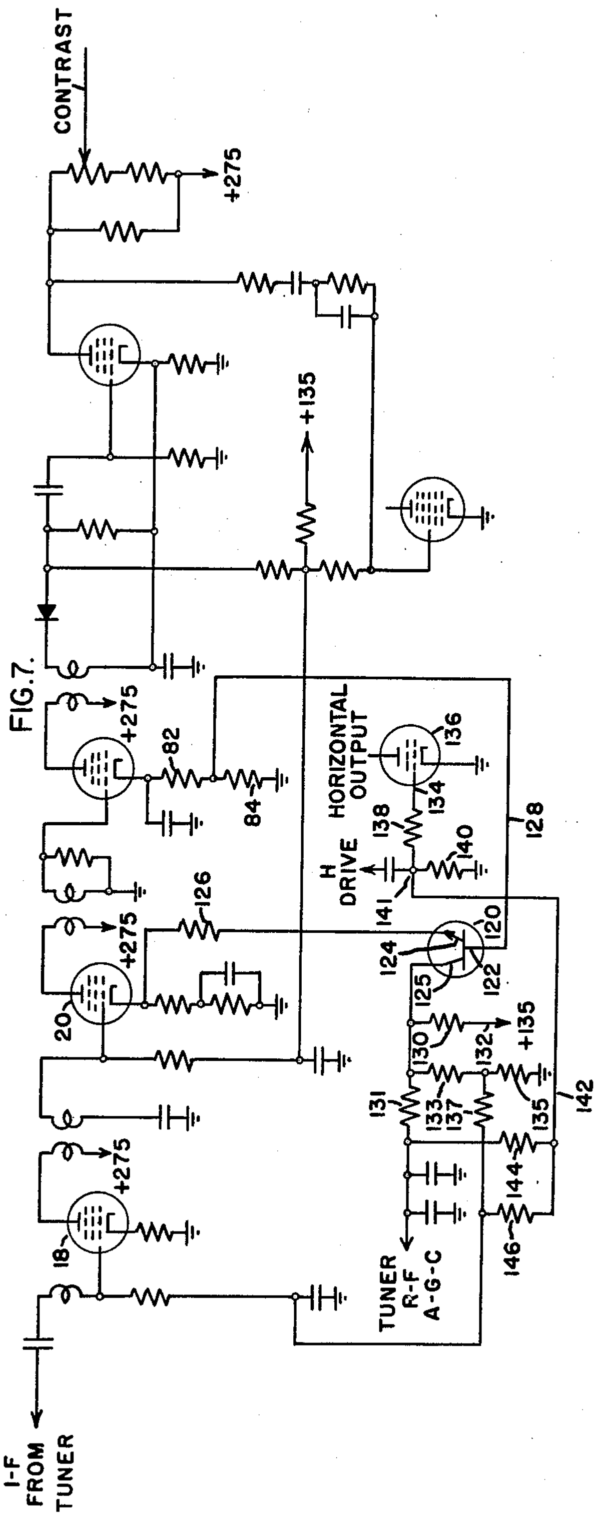
Figure 9:
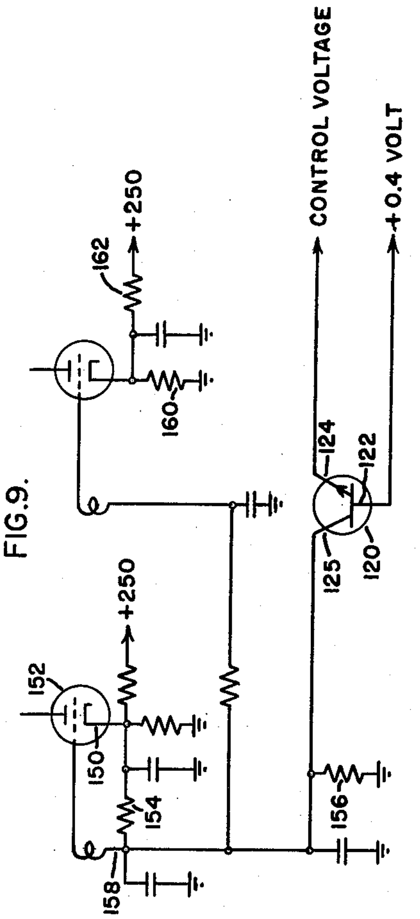
Figure 8:
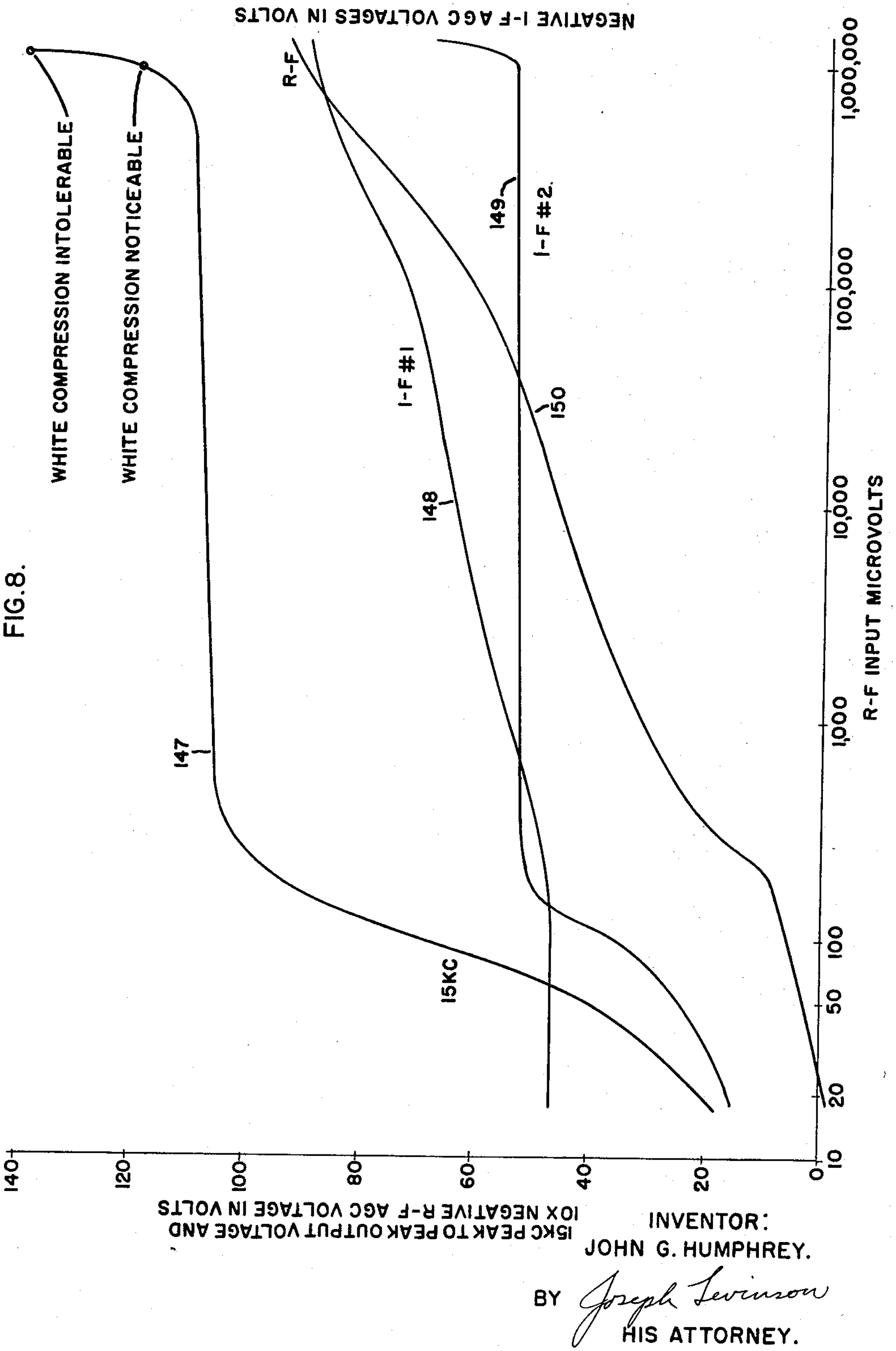

FIGURE 3 is a plot of the relationship of voltages at points in the circuit of FIGURE 1 in which the R.F. A.G.C. voltage is plotted along the scale of ordinates as a function of the I.F. A.G.C. voltage plotted along the scale of abscissa;

FIGURE 4 is a schematic diagram of a portion of a multi-stage receiver circuit in accordance with another embodiment of this invention;

FIGURE 5 is a schematic diagram of a multi-stage receiver in accordance with another embodiment of this invention;

FIGURE 6 is a plot of voltages at various points in the circuit of FIGURE 5 in which amplitude is plotted along the scale of ordinates as a function of the input voltage amplitude plotted along the scale of abscissa;

FIGURE 7 is a schematic diagram of a multi-stage receiver in accordance with another embodiment of this invention;

FIGURE 8 is a plot of voltages at various points in the circuit of FIGURE 7 in which amplitude is plotted along the scale of ordinates as a function of the input voltage amplitude plotted along the scale of abscissa; and FIGURE 9 is a schematic diagram of a portion of a multi-stage receiver circuit in accordance with another embodiment of this invention.

In FIGURE 1 there is shown a multi-stage receiver comprising a tuner and R.F. section 10 followed by an I.F. section 12, detector section 14 and video amplifier 16. The specific schematic circuitry shown is selected from a popular television receiver for the purpose of illustration of this invention. Only the components essential to illustration of the present invention are shown; other circuitry, such as I.F. bypassing of the detector, video compensation, and sound take-off are omitted for simplicity in illustration.

The R.F. tuner is conventional in nature. Similarly, the I.F. stage is of conventional form having cascaded amplifier tubes 18, 20 and 22.

Automatic gain control of the I.F. amplifier stage is provided by deriving a D.C. signal from the junction 25 between resistors 26 and 28 serially coupled between the output of the second detector (junction 24) and the grid 30 of the clipper 32. A signal derived from the second detector will, of course, vary with the picture content for a fixed horizontal sync pulse amplitude. However, the D.C. voltage on the clipper grid also varies with the picture content in a manner essentially opposite to the variation at the second detector. Therefore, the proportional combination of the two signals in the voltage divider will yield, at junction 25, a D.C. voltage essentially independent of picture content. This voltage is fed over lead 34 and applied to grid 36 of the first amplifier 18 through resistor 38 and to grid 40 of the second amplifier stage 20 through resistor 42. As described thus far, the circuitry is identical to the circuitry known to the art for automatic gain control of the I.F. stage.

Control of the gain of R.F. stage must be delayed with respect to the gain control of the I.F. stage and should be balanced with respect thereto. Delay of application of the A.G.C. voltage to the R.F. stage is desirable because the converter stage is generally somewhat noisier than the straight amplifier stage having the same gain. Therefore, no control voltage should be applied to the R.F. amplifier until the gain of the I.F. amplifier has been reduced sufficiently to maintain a good signal-to-noise ratio at the second detector. Balance is desired to prevent biasing the I.F. stage so near cut-off as to introduce distortion on the low amplitude (white) portion of the I.F. signal. For control of the R.F. A.G.C., there is provided a transistor 44 having a base electrode 46, a collector electrode 48 and an emitter eletrode 50 coupled in a grounded base amplifier arrangement. The collector is biased with a negative voltage supply 52.

Although the negative voltage supply may be an independent battery source, for economic reasons it is advantageous to derive the negative bias voltage from the grid 54 of the horizontal output tube 56. In order to prevent a change of picture size with a weak signal, additional current may be drawn from the clipper grid through resistor 58. This particular circuit does have the disadvantage that the clipper grid 30 has some dependency upon the picture content. However, it does have the advantage of supplying an internal source of biasing voltage.

The emitter electrode 50 is coupled through resistor 60 to the cathode 62 of the first amplifier stage 18 for amplification of D.C. voltage on the cathode for use as the R.F. A.G.C. voltage. With the grounded base configuration of the transistor amplifier, when used with a high load impedance, such as the grid of the R.F. amplifier stage, substantial voltage gain can be expected. However, the input resistance of the grounded base amplifier is very low (e.g., the order of 100 ohms) and it is necessary to couple the feedback signal derived from junction 25 to the amplifier through a cathode follower for proper impedance matching. Each controlled amplifier of the I.F. stage constitutes a cathode follower for the feedback signal applied to its grid and the signal derived from the cathodes thereof can be coupled to the emitter 50 of the transistor amplifier 44. The signal feedback to the I.F. stage is thus amplified and applied to the R.F. stage 10 over lead 51 coupling the collector electrode 48 to the R.F. stage 10. The filter network 53 ensures that a D.C. signal is fed back for biasing. The resistor 60 is primarily an isolating resistor to isolate the I.F. signal on the cathode of amplifier 18 and to prevent the resistance seen by the cathode from being seriously affected by the changing input resistance of the transistor.

For values of I.F. amplifier bias on the grid 36 which correspond to weak signal conditions, enough current is injected into the emitter 50 of the transistor 44 to reduce the collector voltage to zero. If, on the other hand, the I.F. amplifier is cut off, the collector voltage will rise to the negative supply voltage (approximately 40 volts) and the R.F. amplifier will be cut off. The high voltage gain of the transistor amplifier provides the desired fast rise of R.F. bias voltage. Thus, it can be seen that the circuit is self regulating That is, the I.F. amplifier is automatically prevented from being biased too close to cut off which would result in compression of the white portions of the video signal. Similarly, the R.F. stage is maintained at full operating gain and no A.G.C. voltage is applied thereto until the I.F. stage gain has been reduced by the undelayed A.G.C. feedback voltage applied thereto. Curves of the operation of the circuit shown in FIGURE 1 are plotted in FIGURES 2 and 3.

Figure 2:
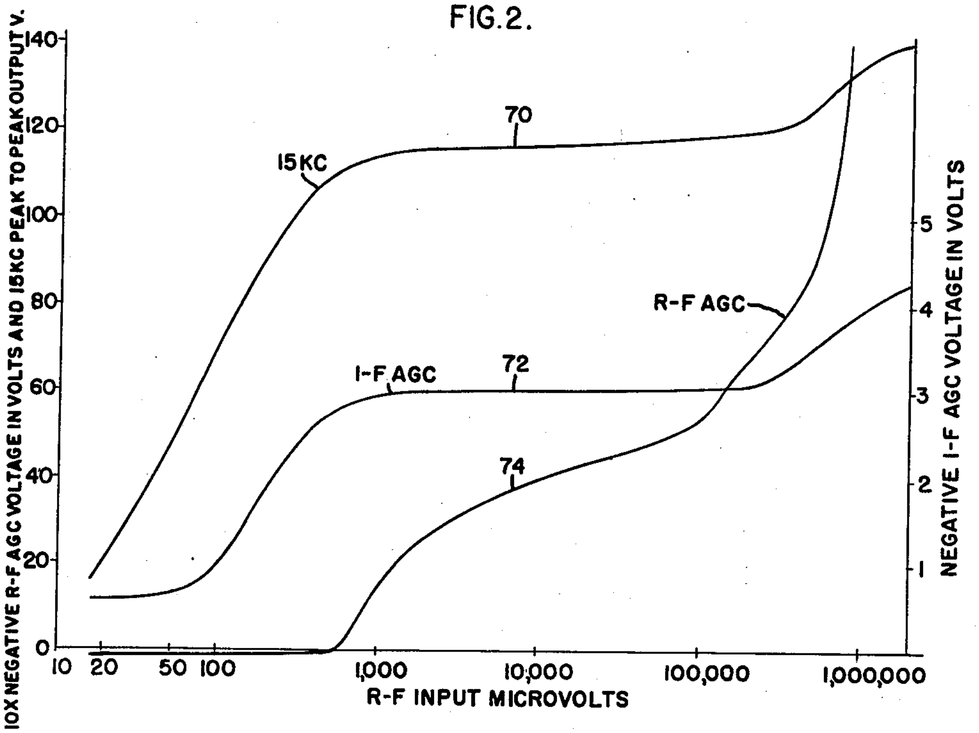
FIGURE 2 is a plot of voltages at various points in the circuit of FIGURE 1 in which amplitude is plotted along the scale of ordinates as a function of the input voltage amplitude plotted along the scale of abscissa.

In FIGURE 2 there is shown a plot of the amplitude of the voltage at various points in the circuit of FIGURE 1 plotted against the amplitude of an input signal of constant frequency. The R.F. input signal of FIGURE 2 and also FIGURES 3, 6 and 8 was 50% amplitude modulated by a 15 kc. sine wave. Curves 70, 72 and 74 of FIGURE 2 respectively are plots of the voltage amplitudes at the output of the video amplifier 16, the I.F. A.G.C. voltage at junction 25, and the R.F. A.G.C. voltage on line 51. As will be noted from the curves, the I.F. A.G.C. voltage is applied to reduce the gain of the I.F. stages as soon as the input voltage is sufficient to provide a signal at the detector of useful amplitudes. However, application of the R.F. A.G.C. voltage is delayed to provide reduction of gain of the I.F. stage prior to the operation of the R.F. A.G.C. thereby ensuring good signal-to-noise ratio in the I.F. section. However, when the R.F. A.G.C. voltage is applied, it rises faster than the I.F. to provide automatic balance of the receiver stages.

As will be noted from curve 70, the receiver circuit is essentially flat in output over a range of inputs from 1,000 to 200,000 microvolts input. It will also be noted that as soon as the R.F. voltage is applied to bias the R.F. section, it rises very rapidly thus providing quick response and preventing the I.F. A.G.C. voltage from biasing the I.F. section sufficiently to cut off the section. Therefore, the troublesome compression of the output waveform on the low amplitude (white) portion of the I.F. signal is prevented.

The relationship between R.F. and I.F. A.G.C. voltages for the circuit of FIGURE 1 is shown by curve 75 of FIGURE 3. The curve 75 clearly shows the delay of the R.F. and the rapid rise of the R.F. A.G.C. voltage with respect to the I.F. A.G.C. voltage. It will be noted that the curve 75 may be moved to the left adding a positive bias to the base of the transistor The curve can be moved toward the right and its steepness increased by increased the resistance 76 in the cathode circuit of amplifier 18, bypassing the added resistance if necessary to prevent I.F. degeneration. However, in the specific circuitry shown the zero bias on the transistor base was found most effective in providing the requisite delay.

In many applications, it is desirable to derive the input to the transistor amplifier from a subsequent stage of the I.F. amplifier. For example, the emitter electrode may be coupled to the cathode of the second amplifier stage 20. The control voltage would then be applied in proper proportions both to the R.F. section and to the first amplifier stage 18 of the I.F. section. This would have the effect of delaying the application of the amplified A.G.C. voltage to both the R.F. and I.F. amplifier sections until the A.G.C. voltage had become sufficiently high to drive the second I.F. stage close to cut off. Thus, the curve of FIGURE 2 representing the output voltage would rise more rapidly for small input signals and the flat portion of the curve 70 would extend further to the right. However, caution is necessary in such circuit connection. If the I.F. signal delivered to an amplifier stage is large in magnitude and if the control grid bias of the stage is nearly at cut off, plate detection in the tube can cause the cathode voltage to rise rather than fall with increasing signal amplitude. Under such conditions, there are two values of gain and hence of developed output voltage which correspond to the same cathode voltage. Thus, the system has two stable states in which the system may be maintained or between which the system may oscillate. In such applications, the circuit shown in FIGURE 4 may advantageously be employed.

In FIGURE 4 there is shown a portion of the circuit shown in FIGURE 1 in which like parts have been identified by identical numerals. In the figure there is shown the second and third I.F. stages 20 and 22 respectively.

The emitter 50 of the transistor amplifier 44 is coupled through resistor 60 to the cathode 62 of amplifier 20. The base electrode 46 is, however, coupled to cathode 80 of amplifier stage 22 through the voltage divider between cathode 80 and ground consisting of resistors 82 and 84. The voltage divider may conveniently be bypassed by bypass capacitor 86 to prevent I.F. degeneration. The collector electrode 48 is coupled through resistor 58 to a negative supply as is shown in FIGURE 1 and to the R.F. stage through lead 87.

In this manner the circuit of FIGURE 4 has the effect of shifting the curve 74 of FIGURE 2 to the left since the base of the transistor is raised above ground potential. To restore the curve to its initial position, there is provided a positive bias 88 applied to the emitter electrode 50 through resistor 90.

Thus, in the circuit shown in FIGURE 4 the A.G.C. loop is essentially independent of plate rectification problems since if the input signal to the second I.F. stage 20 becomes large enough to raise its cathode voltage due to plate detection, the input signal to the third I.F. tube 22, being larger, raises the cathode voltage of the tube even more. By a proper selection of the value of resistor 84 the voltage of the emitter with respect to the base can be made to remain zero or even become negative with increasing amounts of plate detection.

In the circuit shown in FIGURES 1 and 4 the negative supply voltage has been derived from the voltages available at the chassis of practical television receivers, requiring a relatively large collector resistor. If a stiff negative current supply were provided, the collector load resistance could be decreased and operation would be proper under virtually all operating conditions. However, with the practical circuitry shown it will be noted that an increase of collector cut off current with increasing temperature could affect the A.G.C. loop gain.

In many applications it is desirable to utilize the transistor characteristics to provide independence of change of transistor characteristics with change of temperature. In such systems the collector diode may be utilized as a rectifier to provide a negative supply voltage, thus making operation with a lower collector load resistance than is shown in the circuit in FIGURE 4 possible. A circuit utilizing such arrangement is shown in FIGURE 5.

In FIGURE 5 there is shown the transistor amplifier 44 having a base electrode 46, collector electrode 48 and emitter electrode 50. The base electrode 46 is coupled to the voltage divider comprising resistors 82 and 84 between the base of the third amplifier stage 22 and ground. As explained in connection with the circuit of FIGURE 4, this coupling prevents improper operation due to plate detection. The emitter electrode 50 is coupled through isolating resistor 60 to the cathode of the second stage of the I.F. amplifier 20. To obtain the necessary high loop gain, additional resistance 92 must be provided in the cathode circuit in the series with the normal cathode resistor 94. The added cathode resistance has the effect of decreasing the gain of this amplifier stage. The added resistance is bypassed by capacitor 101 to prevent I.F. degeneration. To return the amplifier gain to its normal value, added positive bias is applied to the grid of the tube which bias is derived from the 135 volt supply and is applied from terminal 96 to the grid 40 through resistor 98 and resistor 100 in combination with the A.G.C. voltage derived at junction 25.

The negative supply voltage is derived from an alternating voltage applied to terminal 102 and coupled to the collector electrode 48 of transistor amplifier 44 through capacitor 104 and resistor 106. Such an alternating voltage may, for example, be derived from a tap on the horizontal output transformer as indicated in FIGURE 5 or from the heater supply of the receiver. The transistor acts as a clamp in that the collector diode may be considered essentially a short circuit during the positive portions of the A.C. waveform applied to terminal 102. During negative portions of the waveform applied to terminal 102, the current flowing out of the collector is alpha times the current which flows into the emitter. Resistor 108 and capacitor 110 constitute a low pass filter which permits only the D.C. component of the output voltage to appear as the A.G.C. voltage for the R.F. stage. This output voltage is utilized as the A.G.C. feedback voltage which is fed to the R.F. stage of the receiver When the emitter current is zero the D.C. voltage output will approximately be the average of the negative portion of the voltage waveform applied to terminal 102. When the emitter current is high enough to cause the collector voltage to be essentially zero during the negative portions of the waveform applied to terminal 102, the A.G.C. voltage output is essentially at zero. Obviously, during operation, the circuit conditions will be between these two extremes. Thus, when the emitter current is supplied from the cathode of an I.F. stage which is controlled by an A.G.C. voltage obtained in conventional fashion, the A.G.C. voltage is greatly amplified and applied to the R.F. stage for gain control thereof. The capacitor 103 is provided to prevent the horizontal pulses applied to the collector from reaching the cathode of amplifier 20. Operating curves for the circuit shown in FIGURE 5 are plotted in FIGURE 6.

In FIGURE 6 curve 112 represents the output voltage at the video amplifier, curve 114 represents the A.G.C. voltage at the grid 40, curve 116 represents the A.G.C. voltage at grid 36, and curve 118 represents the R.F. A.G.C. voltage at terminal 111 of FIGURE 5 as a function of the amplitude of the fixed frequency input signal to the R.F. stage. Curve 112 indicates the flat response for a considerable range of input signal amplitude (500 to 500,000 microvolts).

Curves 114, 116 and 118 illustrate the delay of application of the A.G.C. voltage to both the R.F. and I.F. stages and the sharp rise of the R.F. A.G.C. to maintain the grid bias on amplifier 20 essentially constant.

It was found that an increase in $I_{co}$ of approximately 90 microamperes did not change circuit performance appreciably from conditions represented by the curves of FIGURE 6.

In the circuits shown in FIGURES 1, 4 and 5, PNP transistors were employed. In many applications it is advantageous to use an NPN transistor. In such applications, the circuit shown in FIGURE 7 may advantageously be employed.

In FIGURE 7 there is shown an NPN transistor amplifier 120 having a base electrode 122, emitter electrode 124 and a collector electrode 125. As with the circuit shown in FIGURE 4 the emitter electrode is coupled through resistor 126 to the cathode of the second I.F. stage 20. Similarly, the base electrode is coupled through lead 128 to the voltage divider comprising resistors 82 and 84 coupled between the ground and cathode of the third I.F. stage.

The collector electrode may be coupled through resistor 130 to the regular 135 volt supply applied at terminal 132. However, to the positive supply voltage it is necessary to add a fixed negative voltage so that the A.G.C. voltage applied to the R.F. and first I.F. grid can swing negatively. This negative voltage may conveniently be derived in the horizontal output tube. For this purpose, a negative D.C. voltage, derived at the junction 141 in the grid circuit of the horizontal output tube 136 is applied to the network consisting of the resistors 144, 146, 131, 133, 135, 137 and 130. Portions of this negative voltage become parts of the R.F. A.G.C. and I.F. A.G.C. output voltages.

The circuit shown in FIGURE 7 is not sensitive to changes in $I_{co}$ with ordinary changes in temperature because the initial $I_{co}$ is low and because the transistor works into a relatively low collector load resistor.

The performance of the circuit shown in FIGURE 7 is represented by the curves of FIGURE 8. In FIGURE 8 there is shown the curves 147, 148, 149 and 150 which are respectively plots of the amplitude of the output voltage at the video amplifier, the A.G.C. voltage on the grid of tube 18, the A.G.C. voltage on the grid of tube 20, and the R.F. A.G.C. voltage.

As an alternative to linear addition of a negative voltage to the collector voltage, the positive collector voltage may be balanced by an equal positive voltage on the cathode of the tube to which the A.G.C. voltage is applied. A circuit utilizing such arrangement is shown in FIGURE 9.

In FIGURE 9 there is shown a transistor amplifier using a transistor of the NPN type having a base electrode 122, an emitter electrode 124 and collector electrode 125. The cathode voltage of the R.F. amplifier 152 is divided by the divider circuit comprising resistor 154 and the parallel combination of resistor 156 and the collector resistance of transistor 120. The resultant voltage is applied to the grid of the R.F. amplifier through lead 158. Thus, the voltage applied to the grid of the R.F. amplifier tube is always negative with respect to the cathode, without the balancing network required by the circuit of FIGURE 7. The remaining positions of the circuit are similar to that FIGURE 7 and the performance is similar. The resistances 160 and 162 may be intentionally made large, producing D.C. degeneration in this stage, thereby causing the A.G.C. voltage developed by the transistor amplifier to have less effect on this stage than on the R.F. stage, if desired.

While a television receiver has been used for illustration of this invention, it will be apparent that the invention is applicable to multi-stage receivers generally.

This invention may be variously embodied and modified within the scope of the subjoined claims.

What is claimed is:

1. An automatic gain control circuit for an electrical receiving apparatus comprising: a radio frequency amplifier including an amplifying device having a gain control electrode; an intermediate frequency amplifier including first, second and third successively cascade coupled amplifying devices; each of said intermediate frequency amplifying devices having a gain control and a cathode electrode; said second intermediate frequency amplifying device having a cathode electrode circuit; said third intermediate frequency amplifying device having a cathode electrode circuit; means providing an automatic gain control voltage having an amplitude which is a function of the intensity of a signal being received by the apparatus; means coupling said automatic gain control voltage to said control electrode of said second intermediate frequency amplifying device for regulating the gain thereof; an automatic gain control voltage delay amplifier including a transistor having emitter, collector and base electrodes and arranged in a grounded base amplifier configuration; means direct-current coupling said emitter electrode to said cathode electrode circuit of said second intermediate frequency amplifying device; said second intermediate frequency amplifying device cathode electrode circuit arranged for providing a biasing current for said transistor for providing a substantially constant voltage at said cathode electrode over a range of amplitudes of said automatic gain control voltage; means direct-current coupling said delay amplifier base electrode to said cathode electrode circuit of said third intermediate frequency amplifying device; and means coupling said collector electrode to the gain control electrode of said radio frequency amplifying device for providing delayed automatic gain control.

2. An electrical receiving apparatus in accordance with claim 1 in which said delay amplifier means comprises a transistor of the NPN type having a base, a collector and an emitter electrode; means direct-current coupling said emitter electrode to said cathode of said second intermediate frequency amplifying device; means coupling said base electrode to said cathode of said third intermediate frequency amplifying device; and means coupling said collector electrode to said gain control electrode of said radio frequency amplifying device and said first intermediate frequency amplifying device; and means are provided for biasing said collector electrode positively.

3. An apparatus in accordance with claim 2 in which said means for coupling said collector electrode to said radio frequency amplifying device and said first intermediate amplifying frequency device include a negative biasing source.

4. An apparatus in accordance with claim 2 including means for biasing said cathode of said radio frequency amplifying device positively with respect to said gain control electrode of said radio frequency amplifying device.

5. An automatic gain control circuit arrangement for an electrical receiving apparatus comprising: a radio frequency amplifier including an amplifying device having a gain control electrode; an intermediate frequency amplifier including an intermediate frequency amplifying device having a gain control input electrode and an output electrode; means providing an automatic gain control voltage having an amplitude which is a function of the intensity of a signal being received by the apparatus; means coupling said automatic gain control voltage to said gain control input electrode of said intermediate frequency amplifying device for regulating the gain thereof; an automatic gain control voltage delay amplifier including a transistor having input and output electrodes; means direct-current coupling said output electrode of said intermediate frequency amplifying device to said input electrode of said transistor; and means coupling said output electrode of said transistor to said gain control electrode of said amplifying device in said radio frequency amplifier; and having means for said delay amplifier transistor for providing a substantially constant output voltage over a range of amplitude of said automatic gain control input voltage.

6. An automatic gain control circuit for an electrical receiving apparatus comprising: a radio frequency amplifier including an electron discharge amplifying device having a control electrode; an intermediate frequency amplifier including an electron discharge amplifying devices having a control electrode, a cathode electrode, and a cathode electrode circuit; means providing a direct-current automatic gain control voltage having an amplitude which is a function of the intensity of a signal being received by the apparatus; means direct-current coupling said automatic gain control voltage to said control electrode of said intermediate frequency amplifying device for regulating the gain thereof; an automatic gain control delay amplifier including a transistor; said transistor having emitter, base and collector electrodes arranged in a grounded base amplifier configuration; means direct-current coupling said emitter electrode to said cathode electrode circuit of said intermediate frequency amplifying device; and means direct-current coupling said collector electrode to said control electrode of said radio frequency amplifying device; and biasing means for providing a substantially constant voltage at said collector electrode over a range of amplitude of said direct-current automatic gain control voltage.

7. The apparatus of claim 6 wherein said electrical receiving apparatus comprises a television receiver and said receiver includes means for providing a negative supply voltage for said collector electrode; said voltage supply means comprising a horizontal deflection circuit for the receiver including an output electron discharge amplifying devices having a control electrode; means coupling one end of a first resistor to said control electrode of said output electron discharge device; a synchronizing separator-clipper electron discharge amplifying device having a control electrode; means coupling one end of a second resistor to said control electrode of said separator-clipper amplifying device; and means intercoupling the other ends of said first and second resistors and said collector electrode.

8. The apparatus of claim 6 wherein said apparatus comprises a television receiver including a source of alternating voltage and means coupling said alternating voltage to said collector electrode for providing a collector operating voltage.

9. The apparatus of claim 8 wherein said transistor is of the PNP type and said source of alternating voltage is a horizontal output transformer.

10. An automatic gain control circuit arrangement for a television receiver comprising: a radio frequency amplifier including an electron discharge amplifying device having a gain control electrode; a ground bus; an intermediate frequency amplifier including an electron discharge amplifying device having control and cathode electrodes; a cathode electrode circuit for said intermediate frequency amplifying device including an impedance connected intermediate said cathode and said ground bus; means providing an automatic gain control voltage having an amplitude which is a function of the intensity of a signal being received by the receiver; means direct-current coupling said automatic gain control voltage to said control electrode of said intermediate frequency amplifying device for regulating the gain thereof; an automatic gain control delay amplifier including a transistor having emitter, base and collector electrodes; means direct-current coupling said emitter electrode to said cathode electrode circuit of said intermediate frequency amplifying device; said cathode electrode circuit providing a biasing current for said transistor for providing a substantially constant voltage at said collector over a range of amplitude of said automatic gain control voltage; means coupling said base electrode to said ground bus, and means coupling said collector electrode to said gain control electrode of said radio frequency amplifier.

11. An automatic gain control circuit for an electrical receiving apparatus comprising: a radio frequency amplifier including an amplifying device having a gain control electrode; an intermediate frequency amplifier including a first and a succeeding second electron discharge amplifying device; said intermediate frequency amplifying devices each having a control electrode, a cathode electrode, and a cathode electrode circuit; means providing an automatic gain control voltage having an amplitude which is a function of the intensity of a signal being received by the receiver; means direct-current coupling said automatic gain control voltage to said control electrode of said first intermediate frequency amplifier electron discharge amplifying device for regulating the gain thereof; an automatic gain control voltage delay amplifier including a transistor having emitter, collector and base electrodes; means direct-current coupling said emitter electrode to said cathode electrode circuit of said first intermediate frequency amplifier electron discharge amplifying device; said cathode electrode circuit providing a biasing current for said transistor for providing a substantially constant voltage at said collector electrode over a range of amplification of said automatic gain control voltages; means direct-current coupling said base electrode to said cathode electrode circuit of said second electron discharge amplifying device and means coupling said collector electrode of said transistor to said control electrode of said amplifying device in said radio frequency amplifying stage for providing delayed automatic gain control of said radio frequency stage.

12. An automatic gain control circuit for an electrical receiving apparatus comprising: a radio frequency amplifier including at least one amplifying device having a gain control electrode; an intermediate frequency amplifier including first and second succeeding cascaded electron discharge amplifying device; said intermediate frequency amplifying devices each having gain control and cathode electrodes; said second second intermediate frequency amplifying device having a cathode electrode circuit; means providing an automatic gain control voltage having an amplitude which is a function of the intensity of a signal being received by the apparatus; means coupling said automatic gain control voltage to said control electrode of said second intermediate frequency amplifying device for regulating the gain thereof; an automatic gain control voltage delay amplifier including a transistor having emitter, collector and base electrodes arranged in a grounded base configuration; means direct-current coupling said emitter electrode to said cathode electrode circuit of said second intermediate frequency amplifying device; said cathode electrode circuit providing a biasing current for said transistor for providing a substantially constant voltage at said collector electrode over a range of amplitude of said automatic gain control voltage; and means coupling said collector electrode to said gain control electrode of radio frequency amplifying device and to said control electrode of said first intermediate frequency amplifying device for providing delaved automatic gain control.

13. In an electrical receiving apparatus, an automatic gain control circuit arrangement comprising: a radio frequency amplifier; an intermediate frequency amplifier; each of said amplifiers including an amplifying device having a gain control electrode; a direct-current amplifier including an amplifying device having input and output electrodes; means providing a direct-current voltage having an amplitude which is a function of the intensity of a signal being received by the television receiver; means direct-current coupling said output electrode to said radio frequency amplifier gain control electrode; means direct-current coupling said automatic gain control voltage to said intermediate frequency amplifier gain control electrode, means including said intermediate frequency amplifier for coupling said automatic gain control voltage to said input electrode; and means biasing said direct-current amplifier for providing a substantially constant output voltage over a range of amplitudes of said automatic gain control voltage.

References Cited by the Examiner

UNITED STATES PATENTS

| | | | |
|---|---|---|---|
| 2,773,945 | 12/56 | Theriault. | |
| 2,835,795 | 5/58 | Kroger | 325—411 |
| 2,848,603 | 8/58 | Schultz | 325—409 |
| 2,949,533 | 8/60 | Read | 325—411 |
| 2,989,588 | 6/61 | Thomas | 178—7.3 |

DAVID G. REDINBAUGH, *Primary Examiner.*

SAMUEL B. PRITCHARD, JOHN P. WILDMAN, *Examiners.*